United States Patent
Huang

(10) Patent No.: US 8,258,971 B2
(45) Date of Patent: Sep. 4, 2012

(54) LOW VOLTAGE WARNING CIRCUIT

(75) Inventor: Yong-Zhao Huang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 315 days.

(21) Appl. No.: 12/818,120

(22) Filed: Jun. 17, 2010

(65) Prior Publication Data

US 2011/0241894 A1  Oct. 6, 2011

(30) Foreign Application Priority Data

Apr. 2, 2010  (CN) .......................... 2010 1 0138276

(51) Int. Cl.
  *G08B 21/00* (2006.01)
  *H02H 3/24* (2006.01)
(52) U.S. Cl. ............... 340/663; 340/636.15; 340/661; 361/92
(58) Field of Classification Search ............. 340/663, 340/636.15, 660, 661, 662; 361/92; 320/135, 320/136
See application file for complete search history.

(56) References Cited

U.S. PATENT DOCUMENTS

| 3,774,109 | A | * | 11/1973 | Janycky | 324/103 P |
| 3,810,144 | A | * | 5/1974 | Clouse | 340/636.1 |
| 5,196,833 | A | * | 3/1993 | Kemp | 340/663 |
| 5,442,345 | A | * | 8/1995 | Kwon | 340/7.37 |
| 5,666,043 | A | * | 9/1997 | Henry et al. | 323/277 |

* cited by examiner

*Primary Examiner* — Toan N Pham
(74) *Attorney, Agent, or Firm* — Altis Law Group, Inc.

(57) ABSTRACT

A low voltage warning circuit includes an input terminal configured to receive a supply voltage, a reference voltage connected to the input terminal for providing a reference voltage, a transistor connected to the reference voltage circuit and the input terminal, and a silicon controlled rectifier connected to the transistor and the input terminal via a indicating device, the low voltage warning circuit raise a warning through the indicating device when the supply voltage is below the reference voltage.

20 Claims, 2 Drawing Sheets

LOW VOLTAGE WARNING CIRCUIT

BACKGROUND

1. Technical Field

The present disclosure relates to warning circuits and, particularly, to a low voltage warning circuit capable of raising a warning when a voltage is below a preset value.

2. Description of Related Art

Performance of an electronic device will be compromised when the voltage supplied by a power source is below a normal level. However, a current low voltage warning circuit for such an electronic device may be complicated and expensive, causing the cost of the electronic device using the current low voltage warning circuit to be increased.

Therefore, it is desirable to provide a low voltage warning circuit which can overcome the above-mentioned problems.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Embodiments of the disclosure are now described in detail with reference to the drawings.

Figure 1:
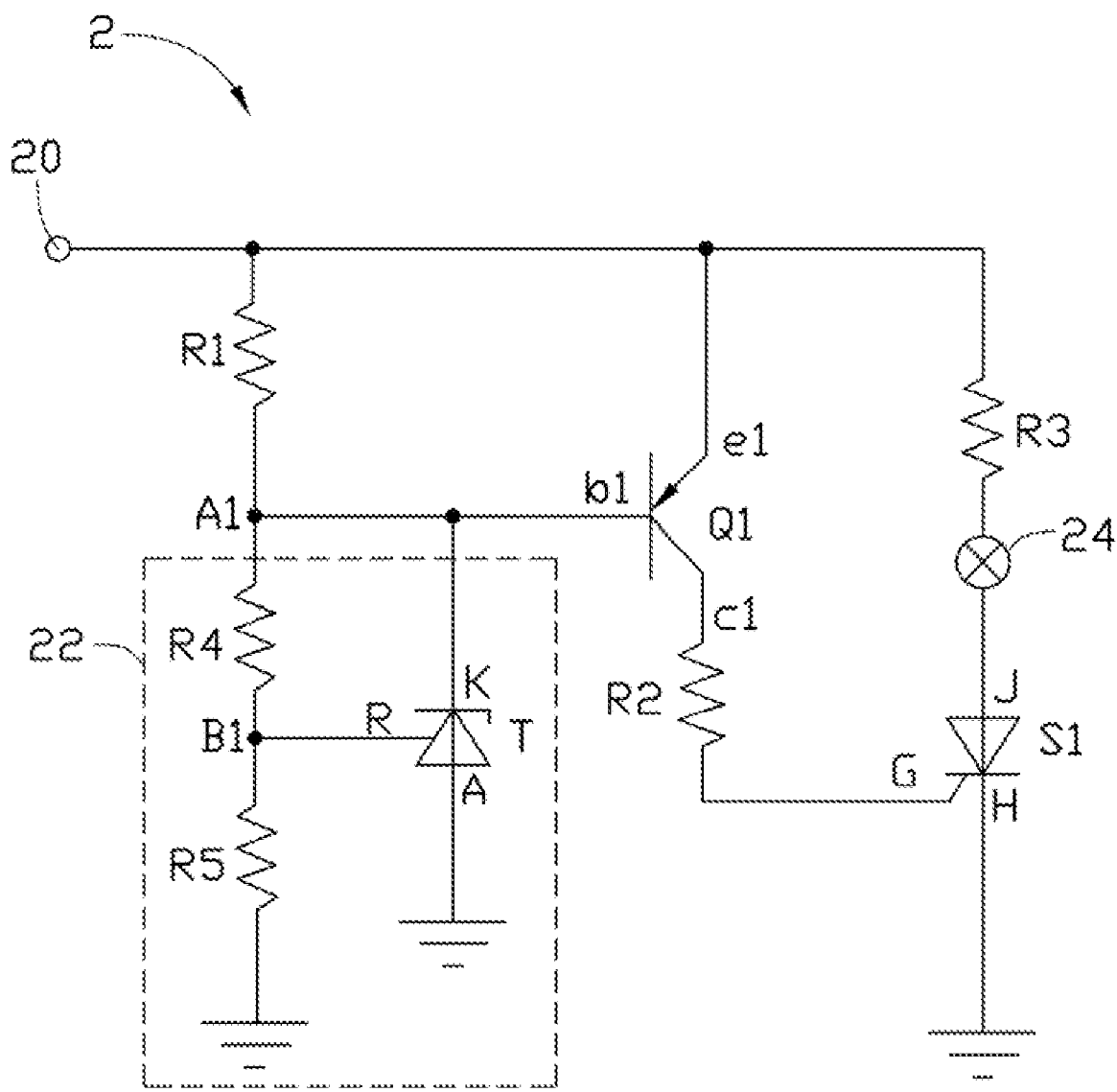
FIG. 1 is a circuit diagram of a low voltage warning circuit in accordance with a first embodiment.

Referring to FIG. 1, a low voltage warning circuit 2, according to a first embodiment, is illustrated. The low voltage warning circuit 2 is configured to receive a supply voltage $V_S$ output from an external power source (not shown) and raise a warning when the supply voltage $V_S$ is below a predetermined normal voltage value $V_N$. The low voltage warning circuit 2 includes an input terminal 20, a reference voltage circuit 22, a transistor Q1, a silicon controlled rectifier (SCR) S1, an indicating device 24, a first resistor R1, a second resistor R2, and a third resistor R3.

The SCR S1 includes a first anode J, a first cathode H, and a control terminal G. The first anode J is connected to the input terminal 20 via the indicating device 24 and the third resistor R3. The first cathode H is grounded.

The transistor Q1 is a PNP transistor. A base b1 of the transistor Q1 is connected to a first node A1 between the first resistor R1 and the reference voltage circuit 22. An emitter e1 of the transistor Q1 is connected to the input terminal 20. A collector c1 of the transistor Q1 is connected to the control terminal G of the SCR S1 via the second resistor R2. The first resistor R1 is connected between the input terminal 20 and the first node A1. The first resistor R1 is configured to control current flowing through the base b1 of the transistor Q1. The second resistor R2 is configured to control current flowing through the emitter e1 of the transistor Q1. The third resistor R3 is configured to control current flowing through the SCR S1.

The indicating device 24 is configured to raise the warning. The indicating device 24 can be an illuminating device or a speaker. In this embodiment, the indicating device 24 is a lamp.

In this embodiment, the reference voltage circuit 22 includes an adjustable reference source T, a first voltage dividing resistor R4, and a second voltage dividing resistor R5. The first voltage dividing resistor R4 includes a first terminal connected to the first node A1 and a second terminal grounded via the second voltage dividing resistor R5. The adjustable reference source T provides a first reference voltage Vref1 and includes a reference terminal R, a second anode A, and a second cathode K. The second cathode K is connected to the first node A1. The reference terminal R is connected to a second node B1 between the first voltage dividing resistor R4 and the second voltage dividing resistor R5. The second anode A is grounded.

The input terminal 20 is connected to the external power source to receive the supply voltage $V_S$. It is assumed that a normal voltage $V_N = V_{Q1} + (1+R1/R2)*Vref1$, wherein the $V_{Q1}$ is a switching voltage of the transistor. In a normal voltage condition, the supply voltage $V_S$ is higher than that of the normal voltage $V_N$, and the voltage of the base b1 of the transistor Q1 is higher than the switching voltage $V_{Q1}$. Therefore, the transistor Q1 is normally turned on to provide the supply voltage $V_S$ to the control terminal G of the SCR S1. Thus, the SCR S1 turns on to form a first current path via the supply voltage $V_S$, the third resistor R3, the indicating device 24, the SCR S1, and ground. That is, the indicating device 24 is lit by the supply voltage $V_S$ to indicate the supply voltage $V_S$ is normal. In a low voltage condition, if the supply voltage $V_S < V_{N1}$, the voltage of the base b1 of the transistor Q1 is lower than the switching voltage $V_Q$. Both the transistor Q1 and the SCR S1 turn off. Thus, the first current path is cut off and the indicating device 24 goes out to raise a warning.

Figure 2:
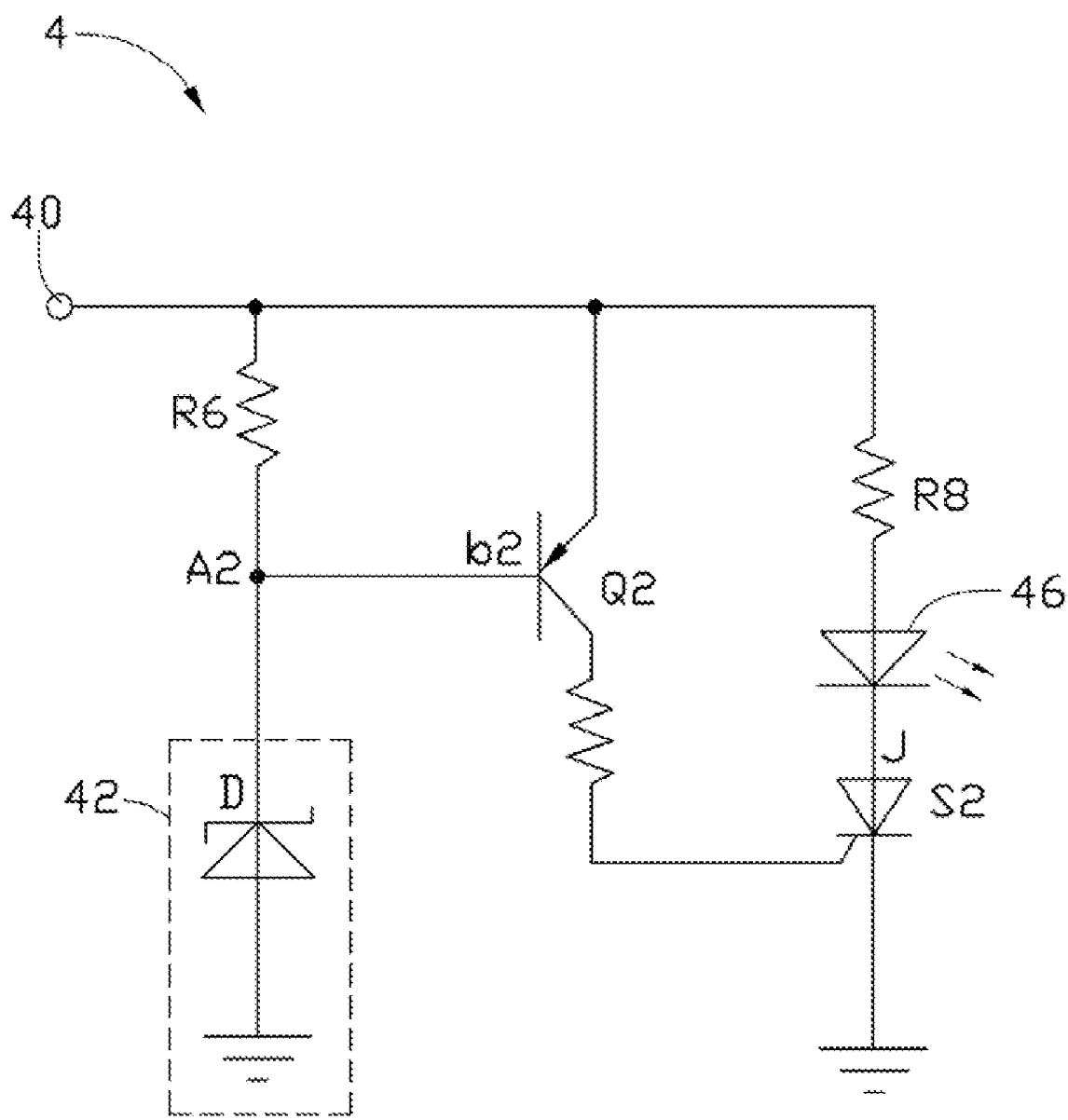
FIG. 2 is a circuit diagram of the low voltage warning circuit in accordance with a second embodiment.

Referring to FIG. 2, a low voltage warning circuit 4 in accordance with a second embodiment is similar to that of the first embodiment except that the reference voltage circuit 42 is a Zener diode and the indicating device 46 is a light emitting diode (LED). The Zener diode 42 includes a first terminal connected to the first resistor R6 and a grounded second terminal. The base b2 of the transistor Q2 is connected to the first node A2 between the first resistor R6 and the first terminal of the Zener diode 42. The first anode J of the SCR S2 is connected to the input terminal 40 via the indicating device 46 and the third resistor R8.

The Zener diode 42 is configured to provide a second reference voltage Vref2. It is assumed that the normal voltage value $V_N = V_{Q1} + Vref2$. In the normal voltage condition, the supply voltage $V_S$ is higher than the normal voltage $V_N$. As described above, both the transistor Q2 and the SCR S2 are turned on. The indicating device 46 is lit to indicate the supply voltage $V_S$ is normal. In the low voltage condition, the supply voltage $V_S < V_N$. Both the transistor Q2 and the SCR S2 are shut off. The indicating device 46 goes out. Thus, the low voltage warning is raised.

While various exemplary and preferred embodiments have been described, it is to be understood that the invention is not limited thereto. To the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. A low voltage warning circuit, comprising:
an input terminal configured to receive a supply voltage;
a reference voltage circuit comprising a first terminal connected to the input terminal and a second terminal grounded;

a transistor comprising a base connected to a first node between the input terminal and the reference voltage circuit, an emitter connected to the input terminal, and a collector; and a silicon controlled rectifier comprising a control terminal connected to the collector, a first anode connected to the input terminal via a indicating device, and a first cathode grounded;

wherein the reference voltage circuit provides a reference voltage to the base, the indicating device raise a warning when the supply voltage below the summation of the reference voltage and a switching voltage of the transistor.

2. The low voltage warning circuit as claimed in claim 1, wherein the reference voltage circuit comprises an adjustable reference source, a first voltage dividing resistor, and a second voltage dividing resistor, the first voltage dividing resistor comprises a first terminal connected to the first node and a second terminal grounded via the second voltage dividing resistor, the adjustable reference source comprises a reference terminal, a second anode, and a second cathode, the reference terminal is connected to a second node between the first voltage dividing resistor and the second voltage dividing resistor, the second cathode is connected to the first node, the second anode is grounded.

3. The low voltage warning circuit as claimed in claim 1, wherein the low voltage warning circuit further comprises a first resistor connected between the input terminal and the first node and configured to control current flowing through the base of the transistor.

4. The low voltage warning circuit as claimed in claim 3, wherein the reference voltage circuit is a Zener diode comprising a first terminal connected to the first resistor and a second terminal grounded.

5. The low voltage warning circuit as claimed in claim 1, wherein the low voltage warning circuit further comprises a second resistor connected between the collector of the transistor and the control terminal of the silicon controlled rectifier and configured to control current flowing through the emitter of the transistor.

6. The low voltage warning circuit as claimed in claim 1, wherein the low voltage warning circuit further comprises a third resistor connected between the indicating device and the input terminal and configured to control current flowing through the silicon controlled rectifier.

7. The low voltage warning circuit as claimed in claim 1, wherein the indicating device is a lamp.

8. The low voltage warning circuit as claimed in claim 1, wherein the indicating device is a light emitting diode.

9. A low voltage warning circuit comprising:
an input terminal configured to receive a supply voltage;
a first voltage dividing resistor comprising a first terminal connected to the input terminal and a second terminal grounded through a second voltage dividing resistor;
an adjustable reference source comprising a reference terminal connected to a first node between the first voltage dividing resistor and the second voltage dividing resistor, a first cathode connected to a second node between the input terminal and the first voltage dividing resistor, and a second anode grounded;
a transistor comprising a base connected to the second node, a emitter connected to the input terminal, and a collector; and
a silicon controlled rectifier comprising a control terminal connected to the collector, a second anode connected to the input terminal via a indicating device, and a second cathode grounded;

wherein the adjustable reference voltage, the first voltage dividing resistor, and the second voltage dividing resistor cooperatively provide a reference voltage to the base, the indicating device to raise a warning when the supply voltage below the summation of the reference voltage and a switching voltage of the transistor.

10. The low voltage warning circuit as claimed in claim 9, wherein the low voltage warning circuit further comprises a first resistor connected between the input terminal and the first node and configured to control current through the base of the transistor.

11. The low voltage warning circuit as claimed in claim 9, wherein the low voltage warning circuit further comprises a second resistor connected between the collector of the transistor and the control terminal of the silicon controlled rectifier and configured to control current through the emitter of the transistor.

12. The low voltage warning circuit as claimed in claim 9, wherein the low voltage warning circuit further comprises a third resistor connected between the indicating device and the input terminal and configured to control current through the silicon controlled rectifier.

13. The low voltage warning circuit as claimed in claim 9, wherein the indicating device is a lamp.

14. The low voltage warning circuit as claimed in claim 9, wherein the indicating device is a light emitting diode.

15. A low voltage warning circuit comprising:
an input terminal configured to receive a supply voltage;
a Zener diode comprising a first terminal connected to the input terminal and a second terminal grounded;
a transistor comprising a base connected to a first node between the input terminal and the Zener diode, an emitter connected to the input terminal, and a collector; and
a silicon controlled rectifier comprising a control terminal connected to the collector, a second anode connected to the input terminal via a indicating device, and a second cathode grounded;
wherein the Zener diode to provide a reference voltage to the base, the indicating device to raise a warning when the supply voltage below the summation of the reference voltage and a switching voltage of the transistor.

16. The low voltage warning circuit as claimed in claim 15, wherein the low voltage warning circuit further comprises a first resistor connected between the input terminal and the first node and configured to control current through the base of the transistor.

17. The low voltage warning circuit as claimed in claim 15, wherein the low voltage warning circuit further comprises a second resistor connected between the collector of the transistor and the control terminal of the silicon controlled rectifier and configured to control current through the emitter of the transistor.

18. The low voltage warning circuit as claimed in claim 15, wherein the low voltage warning circuit further comprises a third resistor connected to the indicating device and the input terminal and configured to control current through the silicon controlled rectifier.

19. The low voltage warning circuit as claimed in claim 15, wherein the indicating device is a lamp.

20. The low voltage warning circuit as claimed in claim 15, wherein the indicating device is a light emitting diode.

* * * * *